United States Patent
Carminati et al.

(10) Patent No.: US 11,933,966 B2
(45) Date of Patent: *Mar. 19, 2024

(54) RESONANT MEMS DEVICE HAVING A TILTABLE, PIEZOELECTRICALLY CONTROLLED MICROMIRROR

(71) Applicant: STMicroelectronics S.r.l., Agrate Brianza (IT)

(72) Inventors: Roberto Carminati, Piancogno (IT); Nicolo' Boni, Albino (IT); Massimiliano Merli, Stradella (IT)

(73) Assignee: STMicroelectronics S.r.l., Agrate Brianza (IT)

(*) Notice: Subject to any disclaimer, the term of this patent is extended or adjusted under 35 U.S.C. 154(b) by 113 days.

This patent is subject to a terminal disclaimer.

(21) Appl. No.: 17/715,639

(22) Filed: Apr. 7, 2022

(65) Prior Publication Data

US 2022/0229287 A1 Jul. 21, 2022

Related U.S. Application Data

(63) Continuation of application No. 16/830,920, filed on Mar. 26, 2020, now Pat. No. 11,327,295.

(30) Foreign Application Priority Data

Mar. 29, 2019 (IT) .................. 102019000004797

(51) Int. Cl.
*G02B 26/08* (2006.01)
*B81B 3/00* (2006.01)

(52) U.S. Cl.
CPC ........ *G02B 26/0858* (2013.01); *B81B 3/0021* (2013.01); *B81B 2201/042* (2013.01)

(58) Field of Classification Search
CPC .............. G02B 26/0858; B81B 3/0021; B81B 2201/042; B81B 3/0045; H10N 30/2043
See application file for complete search history.

(56) References Cited

U.S. PATENT DOCUMENTS

| 2007/0268950 A1 | 11/2007 | Spinelli et al. |
| 2015/0309307 A1 | 10/2015 | Naono |
| 2018/0149859 A1* | 5/2018 | Procopio ............ G02B 26/0858 |

FOREIGN PATENT DOCUMENTS

| CN | 1448333 A | 10/2003 |
| CN | 101221283 A | 7/2008 |

(Continued)

OTHER PUBLICATIONS

IT Search Report and Written Opinion for IT Appl. No. 102019000004797 dated Dec. 2, 2019 (7 pages).

(Continued)

*Primary Examiner* — Euncha P Cherry
(74) *Attorney, Agent, or Firm* — Crowe & Dunlevy LLC (57) ABSTRACT

Disclosed herein is a method of making a microelectromechanical (MEMS) device. The method includes, in a single structural layer, affixing a tiltable structure to an anchorage portion with first and second supporting arms extending between the anchorage portion and opposite sides of the tiltable structure, and forming first and second resonant piezoelectric actuation structures extending between a constraint portion of the first supporting arm and the anchorage portion, on opposite sides of the first supporting arm. The method further includes coupling a handling wafer underneath the structural layer to define a cavity therebetween, and forming a passivation layer over the structural layer, the passivation layer having contact openings defined therein for routing metal regions for electrical coupling to respective electrical contact pads, the electrical contact pads being (Continued)

electrically connected to the first and second resonant piezo-electric actuation structures.

18 Claims, 8 Drawing Sheets

(56) References Cited

FOREIGN PATENT DOCUMENTS

| | | |
|---|---|---|
| CN | 103038694 A | 4/2013 |
| CN | 105301761 A | 2/2016 |
| CN | 108121065 A | 6/2018 |
| CN | 108761773 A | 11/2018 |

OTHER PUBLICATIONS

Baran, Utku, et al: "Resonant PZT MEMS Scanner for High-Resolution Displays," Journal of Microelectromcehanical Systems, vol. 21, No. 6, Dec. 2012, pp. 1303-1310.

First Office Action and Search Report for family-related CN Appl. No. 202010231155.1, dated Jun. 6, 2022, 9 pgs.

* cited by examiner

RESONANT MEMS DEVICE HAVING A TILTABLE, PIEZOELECTRICALLY CONTROLLED MICROMIRROR

PRIORITY CLAIM

This is a continuation of U.S. patent application Ser. No. 16/830,920, filed Mar. 26, 2020, which claims the priority benefit of Italian Application for Patent No. 102019000004797, filed on Mar. 29, 2019, the contents of which are hereby incorporated by reference in their entireties to the maximum extent allowable by law.

TECHNICAL FIELD

This disclosure relates to a resonant Micro-Electro-Mechanical System (MEMS) device having a tiltable, piezoelectrically controlled structure, in particular a micromirror. The micromirror may be uniaxial.

BACKGROUND

MEMS devices are known that have a mirror structure obtained using a semiconductor material technology.

Such MEMS devices are, for example, used in portable apparatuses, such as portable computers, laptops, notebooks (including ultra-thin notebooks), PDAs, tablets, mobile phones or smartphones, for optical applications, in particular for directing beams of light radiation generated by a light source in desired patterns.

By virtue of the small dimensions of MEMS devices, such devices may meet stringent requirements regarding occupation of space, in relation to both area and thickness.

For instance, microelectromechanical mirror devices are used in miniaturized projector modules (e.g., picoprojectors), which are able to project images at a distance or generate desired light patterns.

MEMS mirror devices generally include a mirror element suspended over a cavity and obtained from a semiconductor body so as to be mobile, typically by inclination or rotation, to direct an incident light beam in the desired way.

Figure 1:
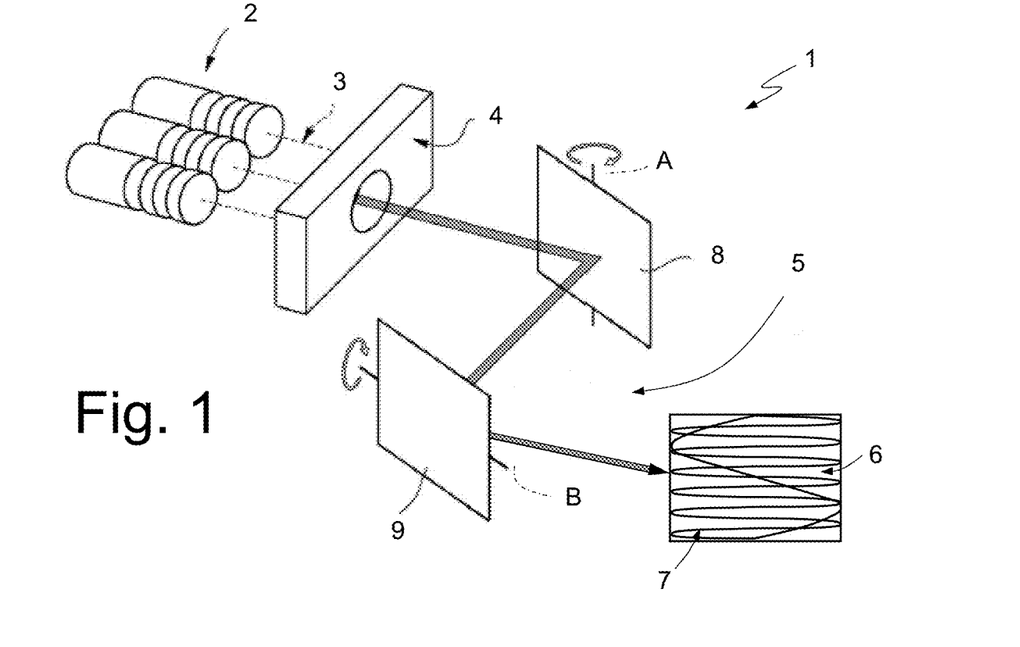
FIG. 1 is a schematic representation of an embodiment of a picoprojector with two one-dimensional mirror elements.

For instance, FIG. 1 schematically shows a picoprojector 1 comprising a light source 2, typically a laser source, generating a light beam 3 made up of three monochromatic beams, one for each base color, which, through an optical system 4 illustrated schematically, is deflected by a mirror element 5 towards a screen 6, where it produces a scan 7. In the example illustrated, the mirror element 5 includes two micromirrors 8, 9, arranged in sequence along the path of the light beam 3 and rotatable about their own axes; namely, a first micromirror 8 is rotatable about a vertical axis A, and a second micromirror is rotatable about a horizontal axis B perpendicular to the vertical axis A. Rotation of the first micromirror 8 about the vertical axis A generates a fast horizontal scan, as illustrated in the detail of FIG. 1. Rotation of the second micromirror 9 about the horizontal axis B generates a slow vertical scan.

Figure 2:
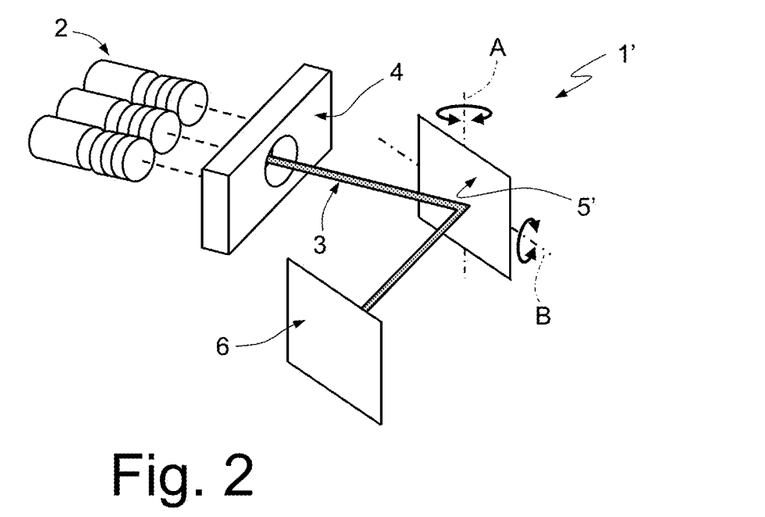
FIG. 2 is a schematic representation of another embodiment of a picoprojector with a two-dimensional mirror element.

In a variant of the system of FIG. 1, illustrated in FIG. 2, the picoprojector, designated by 1', includes a mirror element 5' of a two-dimensional type, controlled to rotate about both the vertical axis A and the horizontal axis B to generate the same scanning pattern 7 as that in FIG. 1.

In both cases, the movement about the vertical axis A is generally of a resonant type and is fast, and the movement about the horizontal axis B is generally of a linear type and slower.

Another application of micromirror systems is represented by 3D gesture-recognition systems. These normally use a picoprojector and an image-capturing device, such as a photographic camera. The light ray may here be in the visible light range, the invisible range or at any useful frequency. The picoprojector for this application may be similar to the picoprojector 1 or 1' of FIGS. 1 and 2, and the light beam 3 deflected by the micromirror 5, 5' is used for scanning an object in two directions. For example, the picoprojector can project small stripes on the object; possible projecting or recessed areas of the object (due to the depth thereof) create deformations in the light rays, which can be detected by the photo camera and processed by adapted electronics to detect the third dimension (i.e., depth).

In both applications, with the considered technology, rotation of the mirror element 5, 5' is controlled through an actuation system, generally of an electrostatic, magnetic, or piezoelectric type.

Electrostatic-actuation systems in general utilize high operating voltages, whereas electromagnetic-actuation systems in general entail high power consumption.

It has thus been proposed to control the scanning movement in a piezoelectric way so as to generate a strong force, thus using a lower actuation voltage and achieving lower power consumption.

For instance, in the mirror device described in United States Patent Publication 2011/0292479 (incorporated by reference), a suspended frame is connected to a fixed structure through spring elements having a serpentine or folded shape formed by a plurality of arms parallel to each other and set side by side. Each arm carries a piezoelectric band, and adjacent piezoelectric bands are biased by voltages having opposite polarity. Due to the characteristics of the piezoelectric materials, the biasing causes deformation in opposite directions (upwards and downwards) of adjacent arms and consequent rotation of the suspended frame in a first direction about the horizontal axis B. By applying an opposite biasing, the frame rotates in a second direction, opposite to the first. The vertical scan can thus be obtained by applying bipolar AC voltages to the arms.

A similar actuation system may control rotation about the vertical axis A to also control the horizontal scan.

Another piezoelectrically actuated mirror device is described in U.S. Pat. No. 10,175,474 (EP 3,178,783), incorporated by reference to the maximum extent allowable under the law. This mirror device has a tiltable structure, rotatable about the horizontal axis B; a fixed structure; and an actuation structure of a piezoelectric type, coupled between the tiltable structure and the fixed structure. The actuation structure is formed by spring elements having a spiral shape. The spring elements are each formed by a plurality of driving arms, which extend transverse to the horizontal axis B, each driving arm carrying a respective piezoelectric band of piezoelectric material. The driving arms are divided into two sets driven in phase opposition to obtain rotation in opposite directions of the tiltable structure about the horizontal axis B.

To reduce sensitivity to spurious movements and provide a structure that is more resistant to impact, U.S. patent application Ser. No. 16/704,484 (IT 102018000011112, filed on Dec. 14, 2018 and EP 19165958.0) incorporated by reference to the maximum extent allowable under the law, describes a mirror device having a piezoelectric-actuation structure of a linear type formed by pairs of driving arms coupled to the tiltable structure through decoupling spiral springs, that are rigid for movements out of the horizontal plane and compliant to torsion about the rotation axis.

United States Patent Application Publication No. 2007/268950, incorporated by reference, discloses a mirror scanner having piezoelectric actuation having actuator arms directly coupled between torsional support arms of the tiltable structure and the anchoring frame.

The current market calls for high-frequency resonant driving solutions for high-resolution projection systems (for example, having 1440 projection rows with increasing angles of aperture).

However, to obtain increased angles of aperture, actuation structures of large area are involved, entailing high consumption.

There is a need in the art to provide a MEMS device having a tiltable structure able to perform a wide oscillation movement at high frequency.

SUMMARY

Disclosed herein is a method of making a microelectromechanical (MEMS) device. The method includes in a single structural layer, affixing a tiltable structure to an anchorage portion with first and second supporting arms extending between the anchorage portion and opposite sides of the tiltable structure, and forming first and second resonant piezoelectric actuation structures extending between a constraint portion of the first supporting arm and the anchorage portion, on opposite sides of the first supporting arm. The method further includes coupling a handling wafer underneath the structural layer to define a cavity therebetween, and forming a passivation layer over the structural layer, the passivation layer having contact openings defined therein for routing metal regions for electrical coupling to respective electrical contact pads, the electrical contact pads being electrically connected to the first and second resonant piezoelectric actuation structures.

The single structural layer may be formed as part of a double structural layer using silicon-on-insulator technology, with the handling wafer being coupled underneath the structure layer by a supporting layer.

Portions of the supporting layer may be selectively removed to form reinforcement elements extending underneath the tiltable structure into the cavity to mechanically reinforce the tiltable structure.

Additional portions of the supporting layer may be selectively removed to further define the cavity.

Portions of the handling wafer may be removed to define the cavity.

The handling wafer may be formed from monocrystalline silicon or polycrystalline silicon.

The handling wafer may be coupled underneath the structure layer by an adhesive layer.

The first supporting arm may be formed to include an elongate portion coupled between the tiltable structure and the anchorage portion, and the constraint portion may be formed at an intermediate position along the elongate portion between the tiltable structure and anchorage portion.

The first support arm may be formed to include first and second torsion springs coupled at the constraint portion, with the first and second torsion springs being configured to be resistant with respect to movements out of a plane of the tiltable structure but complaint to torsion about a longitudinal axis of the elongate portion.

The first and second resonant piezoelectric actuation structures may be configured to cause deflection of the tiltable structure about the longitudinal axis of the elongate portion.

Also disclosed herein is a microelectromechanical (MEMS) device, including a die having a cavity defined therein, an anchorage portion formed by the die, a tiltable structure elastically suspended over the cavity, first and second supporting arms extending between the anchorage portion and opposite sides of the tiltable structure, and first and second resonant piezoelectric actuation structures configured to cause rotation of the tiltable structure. The first supporting arm includes first and second torsion springs, the first torsion spring being coupled to the tiltable structure, the second torsion spring being coupled to the anchorage portion, the first and the second torsion springs being coupled together at a first constraint region.

The first resonant piezoelectric actuation structure may include a first actuation arm carrying a first piezoelectric actuator element and a first displacement-transfer beam, and the second resonant piezoelectric actuation structure may include a second actuation arm carrying a second piezoelectric actuator element and a second displacement-transfer beam.

The first resonant piezoelectric actuation structure may include a first actuation arm carrying a first piezoelectric actuator element and a first displacement-transfer beam, and the second resonant piezoelectric actuation structure may include a second actuation arm carrying a second piezoelectric actuator element and a second displacement-transfer beam.

The first and the second actuation arms may be arranged symmetrically with respect to a rotation axis of the tiltable structure and have a first length in a direction parallel to a first horizontal axis and a first width in a direction parallel to a second horizontal axis. The first and the second displacement-transfer beams may be arranged symmetrically with respect to the first supporting arm and have a second length in a direction parallel to the first horizontal axis and a second width in a direction parallel to the second horizontal axis, where the first width is greater than the second width.

The first and second actuation arms may extend laterally to the second torsion spring, to the first constraint region, and in part to the first torsion spring. The first and the second displacement-transfer beams may extend laterally to the first and the second actuation arms, respectively, the first displacement-transfer beam being arranged between the first actuation arm and a part of the first torsion spring, and the second displacement-transfer beam being arranged between the second actuation arm and part of the first torsion spring.

Also disclosed herein is a method of making a picoprojector apparatus, including configuring a light source to be driven to generate a light beam according to an image to be generated, defining a cavity in a die, forming an anchorage portion in the die, forming a tiltable structure to have a main extension in a horizontal plane defined by first and second horizontal axes perpendicular to each other, elastically suspending the tiltable structure over the cavity using first and second supporting arms extending between the anchorage portion and opposite sides of the tiltable structure, configuring first and second resonant piezoelectric actuation structures to be biased to cause rotation of the tiltable structure about a rotation axis parallel to the first horizontal axis, resisting movement of the tiltable structure out of the horizontal plane and permitting torsion of the tiltable structure about the rotation axis utilizing first and second torsion springs coupled together at a first constraint region, and configuring a driving circuit to supply electrical driving signals the first and second resonant piezoelectric actuation structures to cause rotation of the tiltable structure.

The method may further include forming the first resonant piezoelectric actuation structure as a first actuation arm carrying a first piezoelectric actuator element and a first displacement-transfer beam, and forming the second resonant piezoelectric actuation structure as a second actuation arm carrying a second piezoelectric actuator element and a second displacement-transfer beam.

The method may also further include coupling the first and the second actuation arms to the anchorage portion and configuring the first and second actuation arms to be rigid to torsion and compliant to movements out of the horizontal plane, and coupling the first and the second displacement-transfer beams to the first constraint region and configuring the first and second displacement-transfer beams to be compliant to torsion about the rotation axis.

BRIEF DESCRIPTION OF THE DRAWINGS

For better understanding, some embodiments are now described, purely by way of non-limiting example, with reference to the attached drawings, wherein.

DETAILED DESCRIPTION

Figure 3:
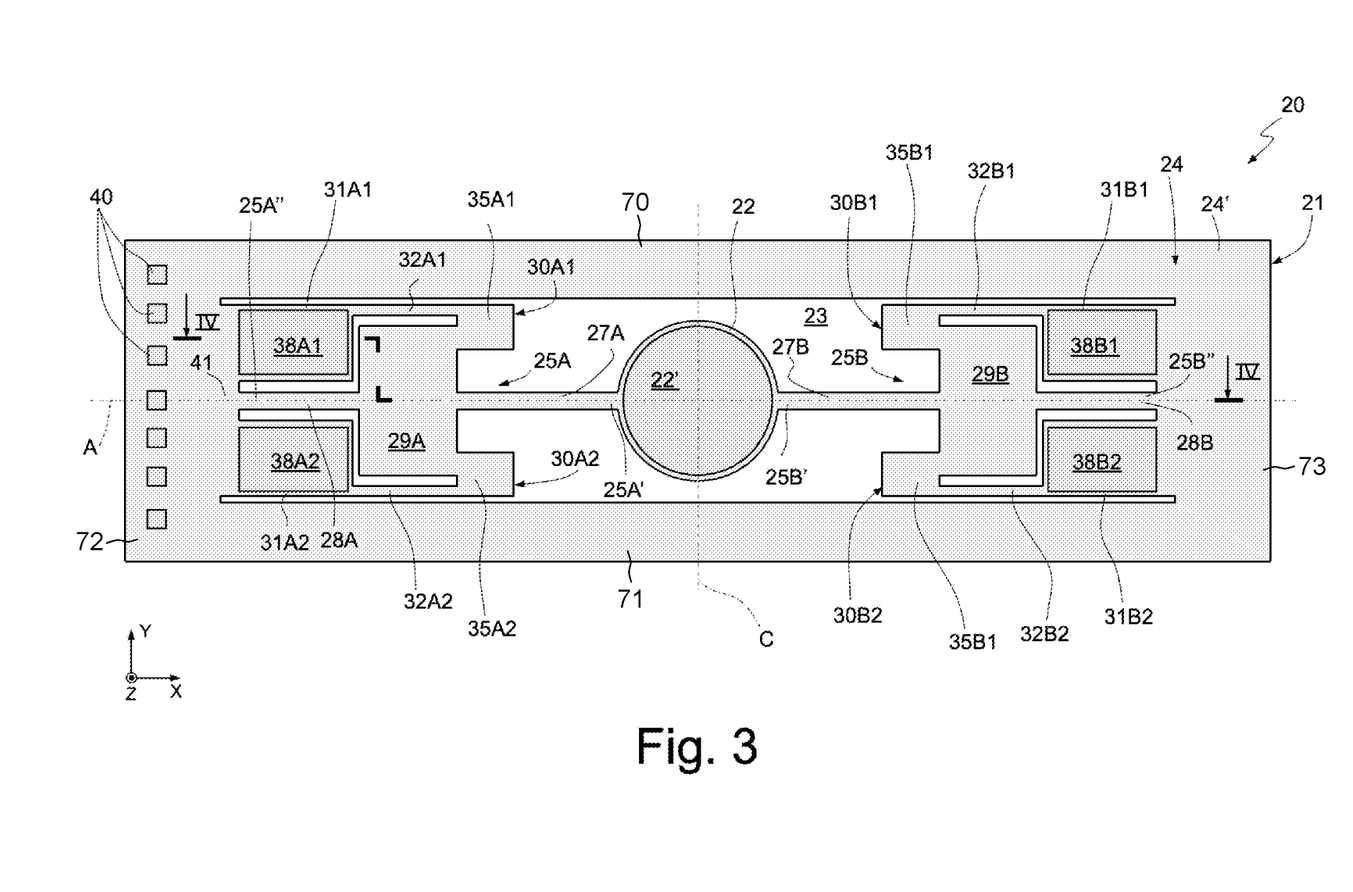
FIG. 3 is a top plan view of an embodiment of a MEMS device having a tiltable structure.

FIG. 3 schematically shows a MEMS device 20, in particular a mirror device.

The MEMS device 20 is formed in a die of semiconductor material, in particular silicon, designated by 21, and comprises a tiltable structure 22, having a main extension in a horizontal plane XY of a Cartesian reference system XYZ and is arranged so as to rotate about a rotation axis, parallel to a first horizontal axis X of the horizontal plane XY. In particular, the rotation axis corresponds to the fast vertical axis A of a picoprojector apparatus of the type illustrated in FIGS. 1 and 2, and therefore is designated once again by A.

The rotation axis A is also a first median symmetry axis for the MEMS device 20, thus also designated by A; a second median symmetry axis C for the MEMS device 20 is parallel to a second horizontal axis Y, which is orthogonal to the first horizontal axis X, extends through a center O of the tiltable structure 22, and defines, with the first horizontal axis X, the horizontal plane XY.

The tiltable structure 22 is suspended over a cavity 23 formed in the die 21, is carried by a fixed structure 24 and has, in the illustrated embodiment, a generically circular shape. However other shapes are possible, from an elliptical to a polygonal shape, for example, square or rectangular. The tiltable structure 22 carries, at its top, a reflecting surface 22' so as to define a mirror structure. The reflecting surface 22' is of an appropriate material, for example, aluminum, or gold, according to whether the light projection is in the visible spectrum or in the infrared spectrum.

The tiltable structure 22 is elastically coupled to an anchorage structure, here formed by a frame portion 24' of the fixed structure 24, through a supporting structure comprising first and second supporting arms 25A, 25B. The supporting arms 25A, 25B extend longitudinally along the first median symmetry axis A, over the cavity 23, between the frame portion 24' of the fixed structure 24 and the tiltable structure 22, on opposite sides of the latter.

In the instant embodiment, the frame portion 24' has, in top view, a generally rectangular shape formed by a first and a second longer sides, indicated by 70, 71 and extending here parallel to the first horizontal axis X, and a first and a second shorter sides, indicated by 72, 73, extending parallel to the second horizontal axis Y.

The supporting arms 25A, 25B have the same shape and are arranged symmetrically with respect to the second median symmetry axis C; the parts that make them up are thus designated by the same reference numbers and the letter A or B according to whether they belong to the first or to the second supporting arm 25A, 25B.

In detail, the first supporting arm 25A has a first end 25A' rigidly coupled to the tiltable structure 22 and a second end 25A" rigidly coupled to the first shorter side 72 of the frame portion 24' of the fixed structure 24, and comprises first and second torsion springs 27A, 28A. The first and second torsion springs 27A, 28A extend as a prolongation of each other along the first median symmetry axis A between a first side of the tiltable structure 22 and a first side of the frame portion 24' of the fixed structure 24.

The second supporting arm 25B has a first end 25B' rigidly coupled to the tiltable structure 22 and a second end 25B" rigidly coupled to the second shorter side 73 of the frame portion 24' of the fixed structure 24, and comprises third and fourth torsion springs 27B, 28B. The third and the fourth torsion springs 27B, 28B extend as a prolongation of each other along the first median symmetry axis A between a second side, opposite to the first side, of the tiltable structure 22 and a second side, opposite to the first side, of the frame portion 24' of the fixed structure 24.

The torsion springs 27A, 27B, 28A, 28B are shaped as a linear beam, along the first horizontal axis X (dimension referred to hereinafter as "length"), and are thin in the direction of the second horizontal axis Y (dimension referred to hereinafter as "width"); furthermore, in the illustrated embodiment, they have a thickness (in a direction parallel to a vertical axis Z of the Cartesian reference system XYZ) greater than the width; consequently, they have an increased flexural stiffness along the first and the second horizontal axes X, Y of the horizontal plane XY and are compliant to torsion about the first median symmetry axis A.

In the first supporting arm 25A, the first and the second torsion springs 27A, 28A are connected together at a first constraint structure 29A; in the second supporting arm 25B, the third and the fourth torsion springs 27B, 28B are connected together at a second constraint structure 29B. The first and the second constraint structures 29A, 29B are rigid and here have a generally rectangular shape with a width (in a direction parallel to the second horizontal axis Y) much greater than the torsion springs 27A, 27B, 28A, 28B and a length (in a direction parallel to the first horizontal axis X) comparable to the torsion springs 27A, 27B, 28A, 28B.

The MEMS device 20 further comprises at least first and second actuation structures 30A1, 30A2, which extend between the frame portion 24' of the fixed structure 24 and the first constraint structure 29A, on first and second sides, respectively, of the first supporting arm 25A, and have a symmetrical structure with respect to the first median symmetry axis A.

The first actuation structure 30A1 comprises a first actuation arm 31A1 and a first displacement-transfer beam 32A1.

In the embodiment of FIG. 3, the first actuation arm 31A1 is rigidly coupled to the first shorter side 72 of the fixed structure 24 at its first end and extends parallel to and alongside the second torsion spring 28A for a length (in a direction parallel to the first horizontal axis X) roughly equal to the second torsion spring 28A. Furthermore, the first actuation arm 31A1 is coupled, at its second end, to the first displacement-transfer beam 32A1. The first displacement-transfer beam 32A1 here extends as a prolongation of, and parallel to, the first actuation arm 31A1, between this and the first constraint structure 29A, and is coupled to the first constraint structure 29A through a first coupling region 35A1. In practice, the first displacement-transfer beam 32A1 extends laterally to the first constraint structure 29A, throughout the entire length of the latter (in a direction parallel to the first horizontal axis X).

Likewise, in the second actuation structure 30A2, the second actuation arm 31A2 is coupled between the second shorter side 73 of the fixed structure 24 and the second displacement-transfer beam 32A2, parallel to and alongside the second torsion spring 28A. The second displacement-transfer beam 32A2 extends as a prolongation of, and parallel to, the second actuation arm 31A2, between the latter and the first constraint structure 29A, and is coupled thereto through a second coupling region 35A2. Also here, the second displacement-transfer beam 32A2 extends laterally to the first constraint structure 29A, throughout the entire length thereof.

In the illustrated embodiment, the MEMS device 20 further comprises third and fourth actuation structures 30B1, 30B2, which extend between the frame portion 24' of the fixed structure 24 and the second constraint structure 29B, on first and second sides, respectively, of the second supporting arm 25B. The third and fourth actuation structures 30B1 and 30B2 are symmetrical to each other with respect to the first median symmetry axis A and are symmetrical to the first and the second actuation structures 30A1, 30A2, respectively, with respect to the second median symmetry axis C.

Consequently, the third actuation structure 30B1 comprises a third actuation arm 31B1 and a third displacement-transfer beam 32B1, and the fourth actuation structure 30B2 comprises a fourth actuation arm 31B2 and a fourth displacement-transfer beam 32B2.

In the third actuation structure 30B1, the third actuation arm 31A2 is coupled between the fixed structure 24 and the third displacement-transfer beam 32B1, parallel to and alongside the fourth torsion spring 28B. The third displacement-transfer beam 32B1 extends as a prolongation of, and parallel to, the third actuation arm 31B1, between the latter and the second constraint structure 29B, and is coupled thereto through a third coupling region 35B1. The third displacement-transfer beam 32B1 extends laterally to the second constraint structure 29B, throughout the entire length of the latter.

Moreover, the fourth actuation arm 31B2 is coupled between the fixed structure 24 and the fourth displacement-transfer beam 32B2, parallel to and alongside the fourth torsion spring 28B. The fourth displacement-transfer beam 32B2 extends as a prolongation of, and parallel to, the fourth actuation arm 31B2, between it and the second constraint structure 29B, and is coupled thereto through a fourth coupling region 35B2. Also here, the fourth displacement-transfer beam 32B2 extends laterally with respect to the second constraint structure 29B, throughout the entire length thereof.

In the embodiment illustrated in FIG. 3, the actuation arms 31A1, 31A2, 31B1, 31B2 have a substantially rectangular shape, with a width (in a direction parallel to the second horizontal axis Y) much greater than the displacement-transfer beams 32A1, 32A2, 32B1, 32B2. In addition, they are suspended over the cavity 23 and carry, on a top surface thereof (not facing the cavity 23) respective piezoelectric actuator elements 38A1, 38A2, 38B1, 38B2, substantially having the same area in the horizontal plane XY as the respective actuation arm 31A1, 31A2, 31B1, 31B2.

As illustrated schematically in FIG. 3, the MEMS device 20 further comprises a plurality of electrical contact pads 40, carried by the frame portion 24' of the fixed structure 24 and electrically connected, in a way not illustrated in detail, to the piezoelectric actuator elements 38A1, 38A2, 38B1, 38B2, to enable electrical biasing thereof by electrical signals fed from outside of the MEMS device 20 (for example, supplied by a biasing device of an electronic apparatus integrating the MEMS device 20).

Moreover, the MEMS device 20 comprises a displacement sensor 41, here of a piezoresistive (PZR) type, formed, for example, by surface diffusion of dopant atoms, and arranged in the frame portion 24' of the fixed structure 24, in proximity of the second end 25A" of the first supporting arm 25A and suspended over the cavity 23, so as to supply a detection signal related to the rotation of the tiltable structure 22 about the rotation axis A. The displacement sensor 41 is electrically coupled to a respective electrical contact pad 40 so as to supply an electrical detection signal outside of the MEMS device 20, for example, to an electronic processing circuit, such as an ASIC (Application Specific Integrated Circuit), not illustrated.

Figures 4, 5:
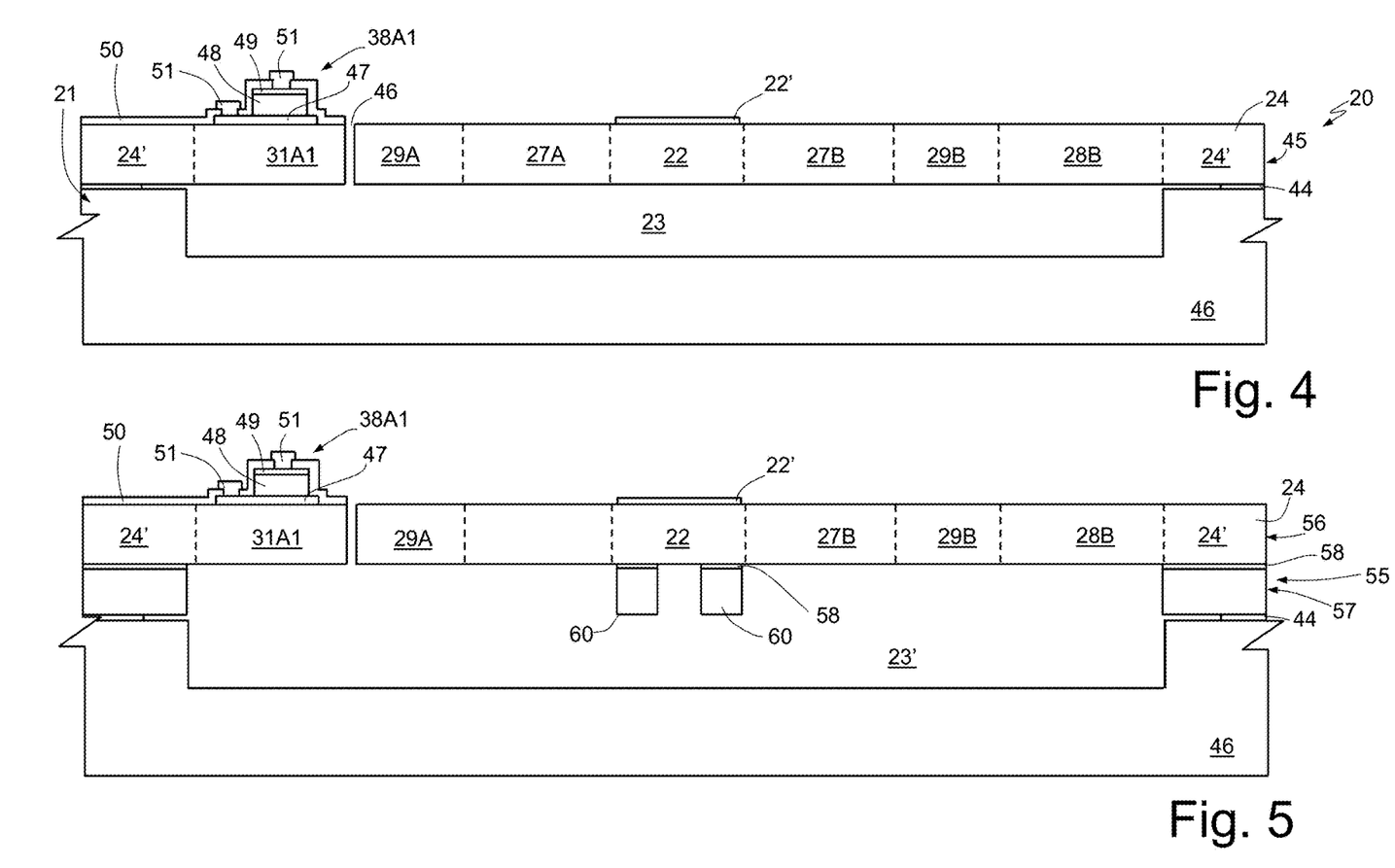
FIG. 4 is a cross-section, taken along section line IV-IV of FIG. 3, of a possible implementation of the MEMS device of FIG. 3.
FIG. 5 is a cross-section, taken along section line IV-IV of FIG. 3, of another implementation of the MEMS device of FIG. 3.

FIG. 4 shows a longitudinal section of the MEMS device 20, taken along section axis IV-IV of FIG. 3, coinciding to a fair extent with the first median symmetry axis A, but extending through the first actuation arm 31A1, to show the structure of the first piezoelectric actuation element 38A1. In particular, FIG. 4 shows the MEMS device 20 when the latter has suspended parts formed in a single structural layer 45, typically of mono- or polycrystalline silicon, defined to have the geometry visible in FIG. 3, where the tiltable structure 22, the supporting arms 25A, 25B, and the actuation structure 30A1, 30A2, 30B1, 30B2 are separated from the frame portion 24' of the fixed structure 24 by a trench 46 (partly visible in FIG. 4).

In detail, in FIG. 4, a handling wafer 46, for example also of mono or polycrystalline silicon, is coupled underneath the structural layer 45 through an adhesive layer 44 and forms the cavity 23.

FIG. 4 further shows the structure of the piezoelectric actuator element 38A1 (the other piezoelectric actuator elements 38A2, 38B1, 38B2 are formed in the same way). In detail, the piezoelectric actuator element 38A1 comprises a stack of layers including a bottom electrode 47, of conductive material, a piezoelectric region 48 (for example, of PZT—Lead Zirconate Titanate), and a top electrode 49. A passivation layer 50, of dielectric material, is formed, as a cover, over the structural layer 45, and has a contact opening for routing metal regions 51 for electrically coupling to respective electrical contact pads 40 (here not visible).

In the embodiment of FIG. 5, the MEMS device 20 (represented in the same section as FIG. 4) has suspended parts formed in a double structural layer 55 formed, for example, by a SOI (Silicon-On-Insulator) wafer. In this case, an active layer 56 of the SOI wafer forms the tiltable structure 22, the supporting arms 25A, 25B, and the actuation structures 30A1, 30A2, 30B1, 30B2, separated by the trench 46, and a supporting layer 57 has been selectively removed to form part of a cavity 23' and forms reinforcement elements 60 extending underneath the tiltable structure 22, parallel to the vertical axis Z. The reinforcement elements 60 have a function of mechanical reinforcement for the tiltable structure 22 and project in the cavity 23'. The supporting layer 57 moreover defines the shape of the frame portion 24' of the fixed structure 24. A dielectric layer 58 extends between the active layer 56 and the supporting layer 57, selectively removed as the supporting layer 57. The handling wafer 46 extends underneath the supporting layer and is also selectively removed to form a bottom part of the cavity 23'.

In the MEMS device 20 of FIGS. 3-5, the torsion springs 27A, 27B, 28A and 28B are designed so as to have a high stiffness to movements out of the horizontal plane XY (along the vertical axis Z) and be compliant to torsion (about the first median symmetry axis A). The actuation arms 31A1, 31A2, 31B1, 31B2 are designed so as to be flexible to deformations out of the plane (controlled by the respective piezoelectric actuator elements 38A1, 38A2, 38B1, 38B2) and stiff to torsion. The displacement-transfer beams 32A1, 32A2, 32B1, 32B2 are designed so as to enable a decoupling torsion along their longitudinal axis (parallel to the first median symmetry axis A). In particular, the pairs of beams formed by the first and the third displacement-transfer beams 32A1, 32B1 and by the second and the fourth displacement-transfer beams 32A2, 32B2, respectively, rotate with a rotation direction concordant with each other and discordant with respect to the other pair. Furthermore, the displacement-transfer beams 32A1, 32A2, 32B1, 32B2 are designed so as to be flexurally rigid (so as to transfer the movement of the actuation arms 31A1, 31A2, 31B1, 31B2 to the supporting arms 25A, 25B, causing rotation thereof and decoupling the flexural movement from the torsional movement). The constraint structures 29A, 29B and the coupling regions 35A, 35A2, 35B1, 35B2 are designed to be substantially rigid to deformations, both of a flexural and of a torsional type so as to co-operate with the displacement-transfer beams 32A1, 32A2, 32B1, 32B2 in flexural/torsional decoupling.

For instance, the entire suspended structure (including the tiltable structure 22, the supporting arms 25A, 25B, and the actuation structures 30A1, 30A2, 30B1, 30B2) has a thickness greater than 80 µm, for example 200 µm; the first and the third torsion springs 27A, 27B have a width (in a direction parallel to the second horizontal axis Y) comprised between approximately 150 µm and 200 µm, and a length (in a direction parallel to the first horizontal axis X) comprised between approximately 2 mm and 4 mm; the second and the fourth torsion springs 28A, 28B have a width comprised between approximately 100 and 200 µm, and a length comprised between approximately 0.3 and 1 mm; the constraint structures 29A, 29B have a width comprised between approximately 0.8 and 2 mm and a length comprised between approximately 0.2 and 1 mm; the displacement-transfer beams 32A1, 32A2, 32B1, 32B2 have a width comprised between approximately 100 and 200 µm and a length comprised between approximately 1 and 2 mm; and the coupling regions 35A, 35A2, 35B1, 35B2 have a width comprised between approximately 300 and 600 µm and a length comprised between approximately 500 and 800 µm.

Figure 6:
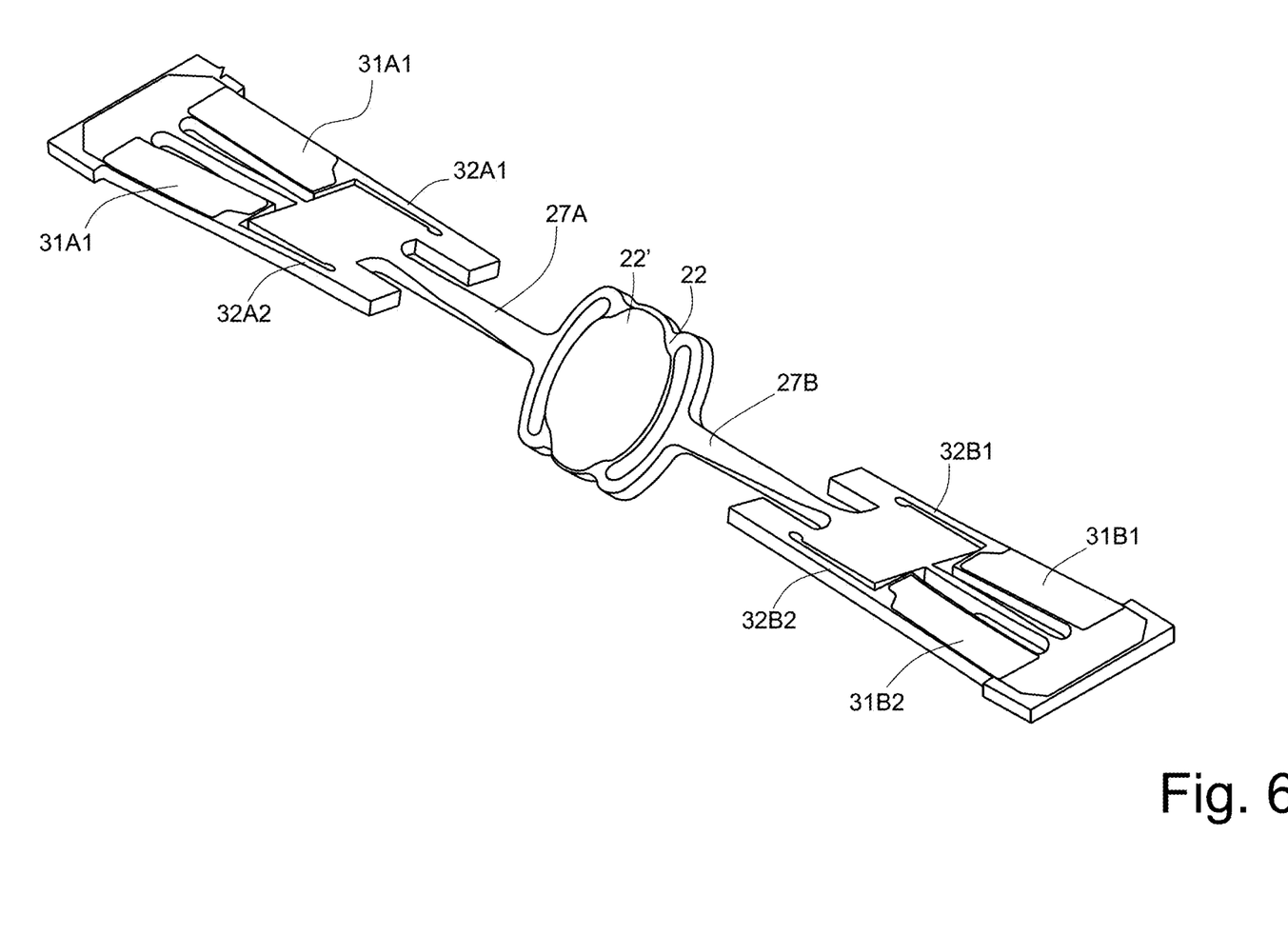
FIG. 6 is a schematic illustration of the MEMS micromirror device of FIG. 3 with the tiltable structure in a rotated position.

Thereby, during operation of the MEMS device 20, application of a biasing voltage V to the third piezoelectric actuator element 38A1 (and here also to the second piezoelectric actuator element 38B1) having a positive value with respect to the second piezoelectric actuator element 38A2, (and possibly to the fourth piezoelectric actuator element 38B2, which may, for example, be connected to a ground reference potential) causes rotation by a positive angle about the first median symmetry axis A, as illustrated in FIG. 6.

Instead, application of a biasing voltage V to the second piezoelectric actuator element 38A2 (and possibly to the fourth piezoelectric actuator element 38B2) having a positive value with respect to the first piezoelectric actuator element 38A1 (and possibly to the third piezoelectric actuator element 38B1, which may for example be connected to the ground reference potential), causes rotation by a negative angle about the first median symmetry axis A, opposite to the illustration in FIG. 6.

By virtue of the presence of two torsion springs in each supporting arm 25A, 25B and coupling of the actuation structures 30A1 and 30A2 to the constraint structures 29A, 29B in an intermediate position in each supporting arm 25A, 25B, the tiltable structure 22 can rotate through a wider angle with respect to other resonant MEMS devices, reaching increased inclination angles (up to 14°) at a biasing voltage V lower than 30 V (for example, 20 V). Thereby, the MEMS device 20 can work at a high frequency (for example, 60 kHz), with a mirror of a large area (for example, with a diameter of 1.1 mm), and an area of the piezoelectric actuator elements 38A1, 38A2, 38B1, 38B2 equal, for example, to 6.5 mm$^2$, albeit having a reduced dissipation (proportional to the square of the biasing voltage), and small dimensions of the die 21 (for example, 13×2.6 mm$^2$).

Furthermore, the displacement sensor 41 (arranged in proximity of the second end 25A" of the first supporting arm 25A) is close to the frame portion 24' of the fixed structure 24, and therefore close to the electrical contact pads 40. Therefore, the connection lines (not illustrated) coupling the displacement sensor 41 to the respective electrical contact pads 40 are short and extend in a non-stressed area of the die 21, and are therefore more robust and ensure a good sensitivity.

Figure 7:
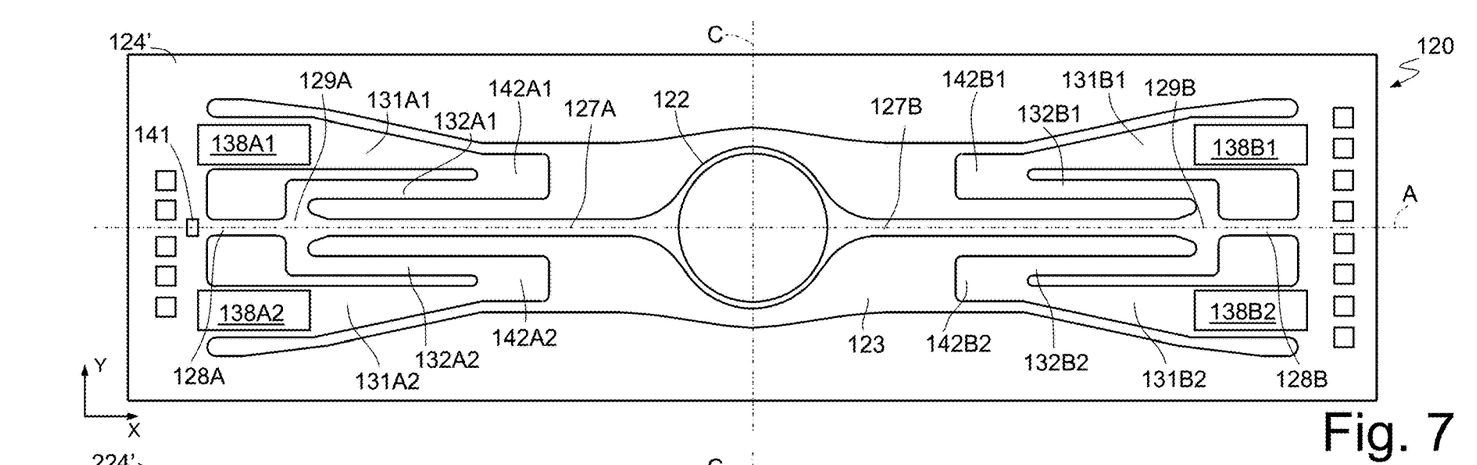
FIG. 7 is a top plan view of a different embodiment of a MEMS device having a tiltable structure.

FIG. 7 shows a MEMS device 120, where the actuation arms, here designated by 131A1, 131A2, 131B1, 131B2, extend alongside both the second torsion spring, here designated by 128A, respectively the fourth torsion spring, here designated by 128B, and along a fair extent of the first torsion spring, here designated by 127A, respectively the third torsion spring, here designated by 127B, and the displacement-transfer beams, here designated by 132A1, 132A2, 132B1, 132B2, extend between the respective actuation arm 131A1, 131A2, 131B1, 131B2 and the respective first torsion spring 127A or third torsion spring 127B.

In detail, in the MEMS device 120, the first and the second actuation arms 131A1, 131A2 extend along the second torsion spring 128A and along approximately two-thirds of the length of the first torsion spring 127A and are connected to the respective displacement-transfer beams 132A1, 132A2 through own intermediate-coupling regions 142A1, 142A2 reversed C-shaped. Vice versa, the third and the fourth actuation arms 131B1, 131B2 extend along the fourth torsion spring 128B and along approximately two-thirds of the length of the third torsion spring 127B and are connected to the respective displacement-transfer beams 132B1, 132B2 through own C-shaped intermediate-coupling regions 142B1 and 142B2.

Here, the piezoelectric actuator elements, designated by 138A1, 138A2, 138B1, 138B2, extend on part of the respective actuation arms 131A1, 131A2, 131B1, 131B2.

The displacement-transfer beams 132A1, 132A2, 132B1, 132B2 are connected to the torsion springs 127A, 127B, 128A, 128B at the constraint structures, here designated by 129A, 129B, and are of smaller dimensions than in FIG. 3.

Moreover, in the embodiment of FIG. 7, in top plan view, the actuation arms 131A1, 131A2, 131B1, 131B2 no longer have a regular rectangular shape, but have a part, close to the intermediate-coupling regions 142A1, 142A2, 142B1 and 142B2, having a trapezoidal shape with a decreasing width towards the intermediate-coupling regions 142A1, 142A2, 142B1, and 142B2. Also the outer perimeter of the cavity, here designated by 123, is no longer rectangular, but follows the profile of the actuation arms 131A1, 131A2, 131B1, 131B2. Here, the tiltable structure is designated by 122.

For instance, in the embodiment of FIG. 7, the actuation arms 131A1, 131A2, 131B1, 131B2 have a length comprised between approximately 2 and 3 mm and a width comprised between 400 and 800 mm; the displacement-transfer beams 132A1, 132A2, 132B1, 132B2 have a length comprised between approximately 1 and 2 mm; the first and the third torsion springs 127A, 127B have a length comprised between approximately 2 and 4 mm; and the second and fourth torsion springs 128A, 128B have a length comprised between approximately 300 and 600 µm.

By virtue of the position of the displacement-transfer beams 132A1, 132A2, 132B1, 132B2, the MEMS device 120 has a smaller length (in a direction parallel to the rotation axis A) than the MEMS device 20 of FIGS. 3-5.

Figure 8:
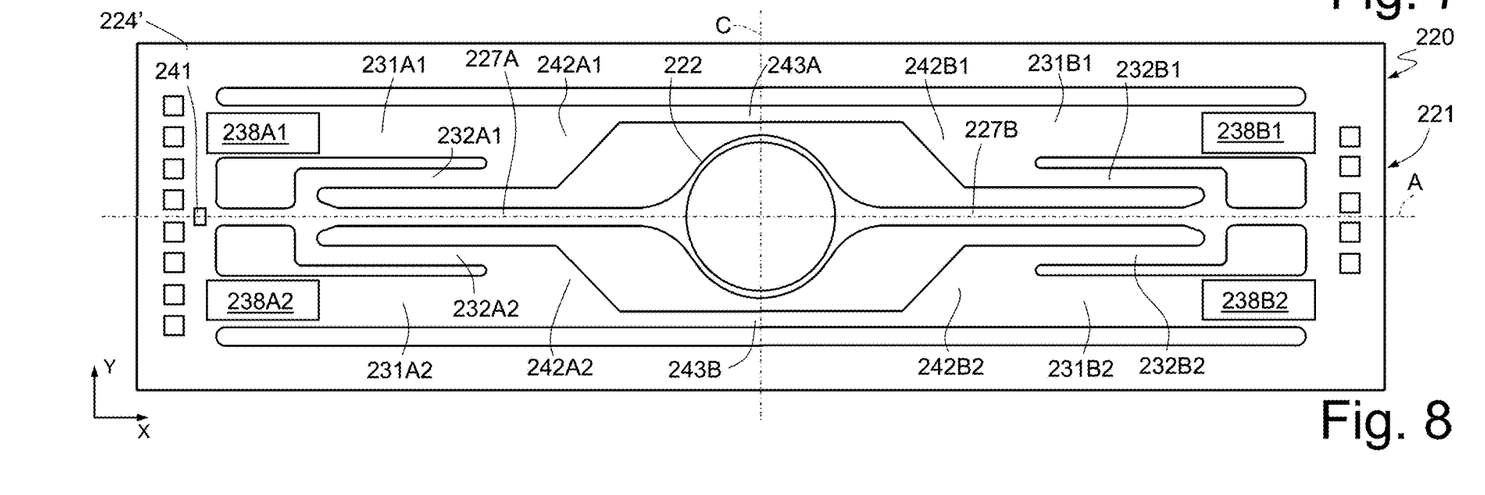
FIG. 8 is a top plan view of another embodiment of a MEMS device having a tiltable structure.

FIG. 8 shows a MEMS device 220 similar to the MEMS device 120 of FIG. 7, where the actuation arms, here designated by 231A1, 231A2, 231B1, 231B2, are connected together through a first and a second coupling arm 243A, 243B.

In detail, in FIG. 8, the actuation arms, here designated by 231A1, 231A2, 231B1, 231B2 have an elongated shape, substantially rectangular in top plan view, and extend for a length roughly equal to two-thirds of the length of the first torsion spring, here designated by 227A, and of the third torsion spring, here designated by 227B, respectively.

The actuation arms 231A1, 231A2, 231B1, 231B2 are connected also here to the respective displacement-transfer beams, here designated by 232A1, 232A2, 232B1, 232B2 through intermediate-coupling regions of their own, here designated by 242A1, 242A2, 242B1 and 242B2, having the shape, for example, of an isosceles trapezium with the base side aligned with the side of the respective actuation arm 231A1, 231A2, 231B1, 231B2 that faces the frame portion, here designated by 224'.

Furthermore, the first and the third actuation arms 231A1, 231B1 are coupled together by the first coupling arm 243A, which extends as a prolongation of the actuation arms and of the intermediate-coupling regions 242A1, 242B1 with the side facing the frame portion 224' aligned to the corresponding sides of the associated actuation arms 231A1, 231B1 and of the associated intermediate-coupling regions 242A1, 242B1.

Likewise, the second and the fourth actuation arms 231A2, 231B2 are coupled together by the second coupling arm 243B, which is arranged and configured symmetrically to the first coupling arm 243A with respect to the first median symmetry axis A.

The first and the second coupling arms 243A, 243B have a width (in a direction parallel to the second horizontal axis Y) smaller than the actuation arms 231A1, 231A2, 231B1, 231B2, thereby they may deform during the rotation of the MEMS device 220. For instance, the coupling arms 243A, 243B may have a width comprised between approximately 100 and 200 µm.

By virtue of the presence of the coupling arms 243A, 243B, the MEMS device 220 of FIG. 8 is able to remove spurious mechanical modes that could be problematic. In fact, due to non-ideality of the real structure, in some cases the constraint structures 129A, 129B may rotate in opposite directions, and the actuation arms 231A1 and 231B1 (or 231A2, 231B2) arranged on the same side of the rotation axis X and the corresponding displacement-transfer beams 232A1 and 232B1 (or 232B2 and 232B2) may tend to move in opposite directions. The coupling arms 243A, 243B prevent such undesired opposite movement.

Figure 9:
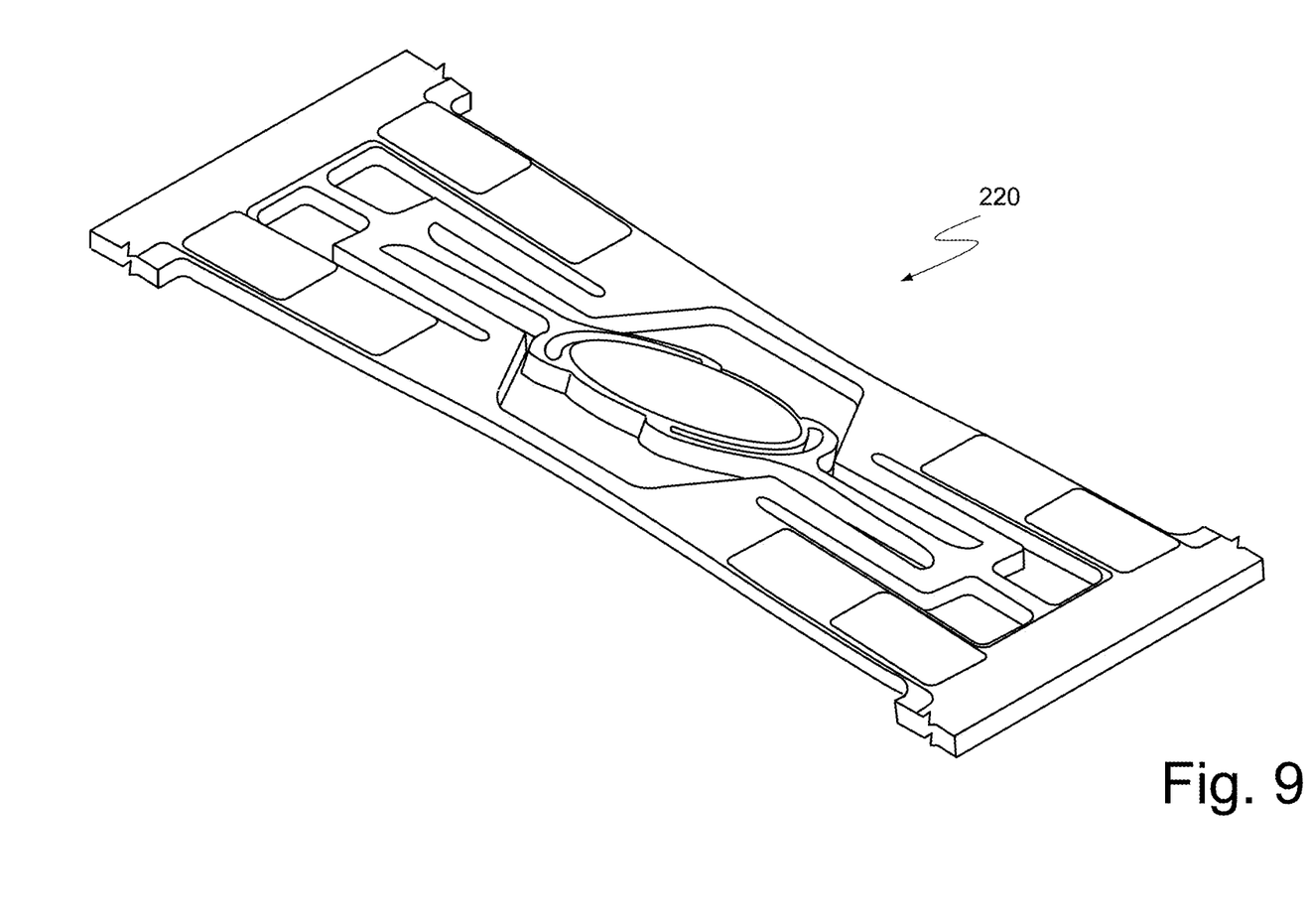
FIG. 9 is a schematic illustration of the MEMS device of FIG. 3, 7 or 8 with the tiltable structure in a rotated position.

The MEMS devices 120 and 220 operate like the MEMS device 20. FIG. 9 shows, for example, rotation of the MEMS device 220 of FIG. 8 when the second and the fourth piezoelectric actuator elements, designated by 238A2 and 238B2 in FIG. 8, are biased by a biasing voltage V that is positive with respect to the first and the second piezoelectric actuator elements, here designated by 238A1 and 238B1, and grounded. In particular, FIG. 9 shows the negative rotation of the tiltable structure, designated by 222 in FIG. 8, through an angle of 16° for a voltage V=30 V at a frequency of 25 kHz. Studies conducted by the present applicant have shown that, in this condition, the MEMS device 220 has an acceptable stress level and a lower power consumption, by a factor of 2, with a 30% smaller area of the die, designated by 221 in FIG. 8, than known solutions.

Figure 10:
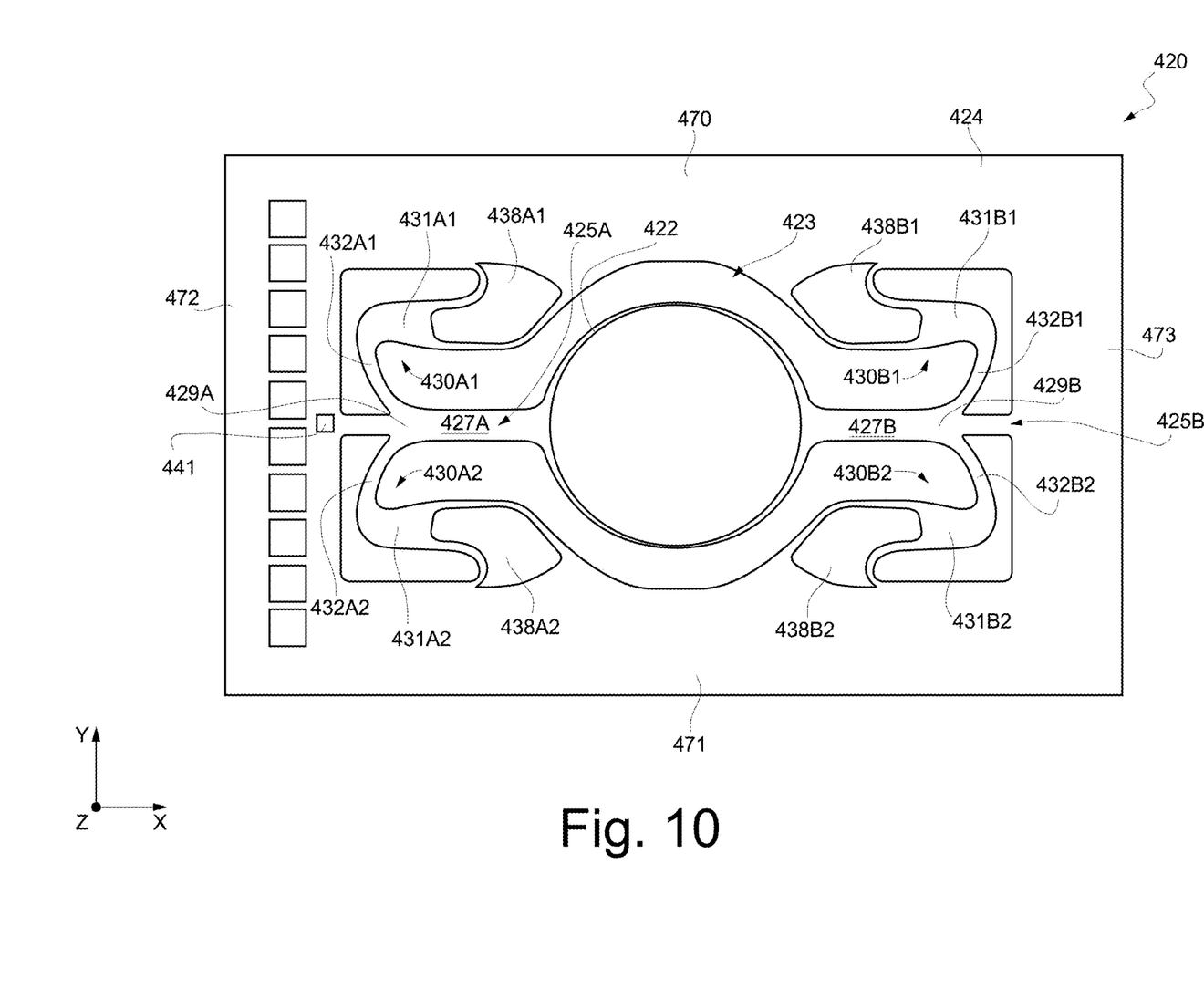
FIG. 10 is a top plan view of still another embodiment of a MEMS device having a tiltable structure.

FIG. 10 shows a MEMS device 420 with a tiltable structure denoted here by 422, where first and second actuation arms, here designated by 431A1, 431A2, extend alongside the first torsion spring, here designated by 427A, roughly parallel thereto, and the third and fourth actuation arms, here designated by 431B1, 431B2, extend alongside the third torsion spring, here designated by 427B, roughly parallel thereto. In addition, the first and second displacement-transfer beams, here designated by 432A1, 432A2, extend transversely to the first supporting arm, here designated by 425A, between the first constraint structure 429A and the respective actuation arm 431A1, 431A2; and the third and fourth displacement-transfer beams, here designated by 432B1, 432B2, extend transversely to the second supporting arm, here designated by 425B, between the second constraint structure 429B and the respective actuation arm 431B1, 431B2.

In addition, in the MEMS device 420, the first, second, third and fourth actuation arms 431A1, 431A2, 431B1, 431B2 are fixed to the frame portion, here designed by 424', on sides thereof different from the embodiments of FIGS.

3-9. While, in the embodiments of FIGS. 3-9, both the supporting arms (25A, 25B in FIG. 3) and actuation arms (30A1, 30A2, 30B1, 30B2 in FIG. 3) are fixed to the shorter sides (72, 73 in FIG. 3) of the frame portion 24, in FIG. 10, the supporting arms 425A, 425B are fixed to the shorter sides, here designed by 472, 473, of the frame portion 424' and the actuation arms 431A1, 431A2 are fixed to the longer sides, here designed by 470, 471, of the frame portion 424'.

Furthermore, in the embodiment of FIG. 10, the first, second, third and fourth actuation structures, here designated by 430A1, 430A2, 430B1, 430B2, are generally S-shaped, with a smooth, curved connection between each actuation arms 431A1, 431A2, 431B1, 431B2 and the respective displacement-transfer beams 432A1, 432A2, 432B1, 432B2 and the actuation arms 431A1, 431A2, 431B1, 431B2 are sort of bent back from the respective displacement-transfer beam 432A1, 432A2, 432B1, 432B2 toward the tiltable structure 422.

In addition, the first, second, third and fourth actuation structures 430A1, 430A2, 430B1, 430B2 have a variable width, increasing from the respective constraint structure 429A, 429B toward the frame portion 422'.

Analogously to the embodiments of FIGS. 3-9, the piezoelectric actuator elements, here designated by 438A1, 438A2, 438B1, 438B2, extend on the respective actuation arms 431A1, 431A2, 431B1, 431B2.

Moreover, also here a displacement sensor 441 of a piezoresistive (PZR) type is arranged in the frame portion 424' of the fixed structure 424, in proximity of the end of the first supporting arm 425A fixed to the frame portion 424' and suspended over the cavity (designated here by 423).

In practice, in the MEMS device 420, the first and third torsion springs 427A, 427B form main torsional springs for allowing rotation of the tiltable structure 422 and the second and fourth torsion springs 428A; 428B form secondary torsional springs to allow sensing of the rotation angle of the tiltable structure 422. Here, the first and third torsion springs 427A, 427B are longer than the second and fourth torsion springs 428A, 428B.

By virtue of the above arrangement of the actuation arms 431A1, 431A2, 431B1, 431B2 and the respective piezoelectric actuator elements 438A1, 438A2, 438B1, 438B2 laterally to the first and third torsion springs 427A, 427B, the MEMS device 420 of FIG. 10 has a shorter length along the first horizontal axis X and thus a highly compact size in terms of die area. In addition, due to the variable width of the actuation structures 430A1, 430A2, 430B1, 430B2, the stiffness thereof may be differentiated and optimized according to the specific task of the different portions. In particular, the lower width of the displacement-transfer beams 432A1, 432A2, 432B1, 432B2 allows them to better transfer the movement and minimize the stresses due to deformation and the larger width of the actuation arms 431A1, 431A2, 431B1, 431B2 allows arranging larger piezoelectric actuator elements 438A1, 438A2, 438B1, 438B2, which thus operate with higher force. The structure is thus very efficient.

The MEMS device 20; 120; 220; 420 may be used in a picoprojector 301 adapted to be functionally coupled to a portable electronic apparatus 300, as illustrated hereinafter with reference to FIGS. 11-13.

Figure 11:
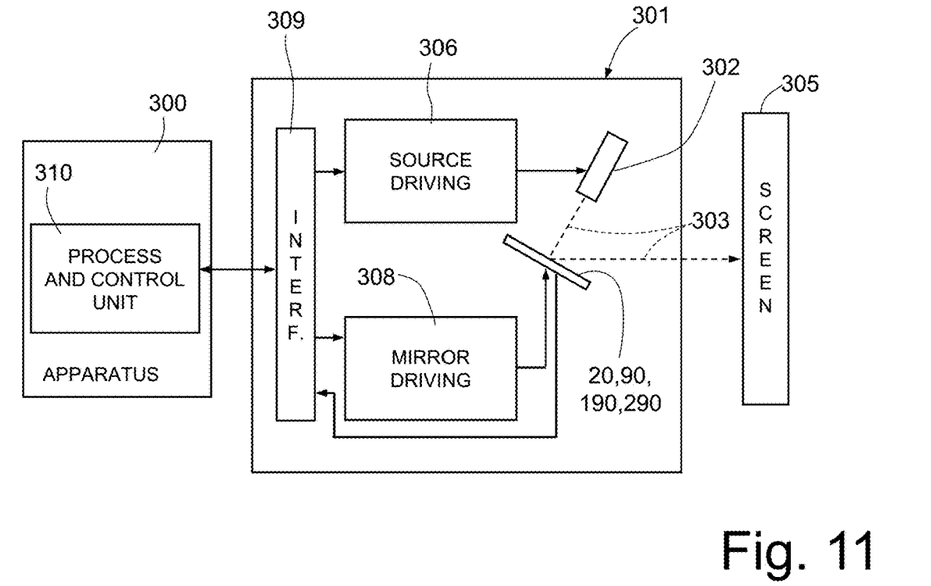
FIG. 11 is a block diagram of a picoprojector using the present MEMS device.

In detail, the picoprojector 301 of FIG. 11 comprises a light source 302, for example, of a laser type, intended to generate a light beam 303; the MEMS device 20; 120; 220, intended to receive the light beam 303 and to direct it towards a screen or display surface 305 (external to and set at a distance from the picoprojector 301); a first driving circuit 306, intended to supply appropriate control signals to the light source 302, for generating the light beam 303 according to an image to be projected; a second driving circuit 308, intended to supply driving signals for rotating the tiltable structure 22; 122; 222 (FIGS. 4, 8, and 9) of the MEMS device 20; 120; 220; and a communication interface 309, intended to receive, from an external control unit 310, for example included in the portable apparatus 300, light information on the image to be generated, for example in the form of an array of pixels. The light information is input for driving the light source 302.

Furthermore, the control unit 310 may include a unit for controlling the angular position of the tiltable structure 22; 122; 222 of the MEMS device 20; 120; 220. To this end, the control unit 310 may receive the signals generated by the displacement sensor 41; 141; 241 (FIGS. 4, 8, and 9) through the interface 309 and accordingly control the second driving circuit 308.

Figure 12:
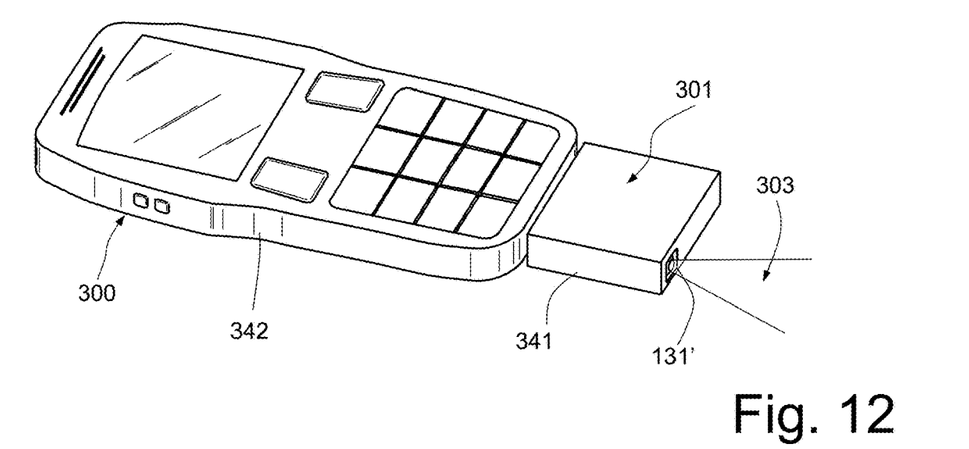
FIGS. 12 and 13 show variants of coupling between the picoprojector of FIG. 11 and a portable electronic apparatus.

The picoprojector 301 may be a stand-alone accessory separate from an associated portable electronic apparatus 300, for example, a mobile phone or smartphone, as shown in FIG. 12. In this case, the picoprojector 301 is coupled to the portable electronic apparatus 300 through appropriate electrical and mechanical connection elements (not illustrated in detail). Here, the picoprojector 301 has its own casing 341, with at least a portion 341' transparent to the light beam 303 coming from the MEMS device 20, 120, 220 and the casing 341 of the picoprojector 301 is coupled in a releasable way to a respective case 342 of the portable electronic apparatus 300.

Figure 13:
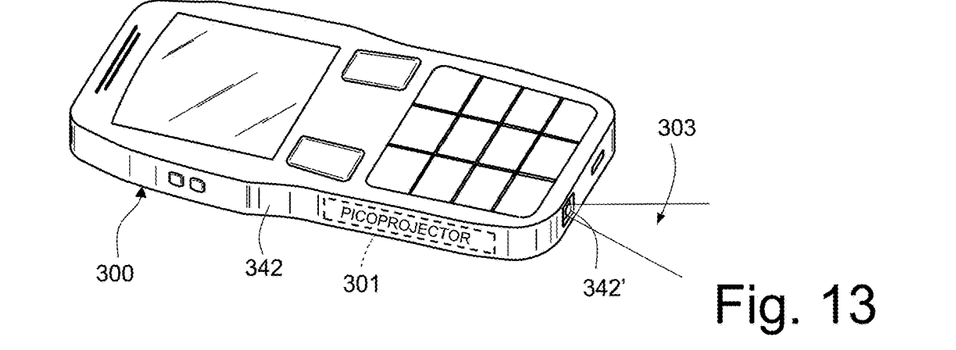

Alternatively, as illustrated in FIG. 13, the picoprojector 301 may be integrated within the portable electronic apparatus 300 and arranged inside the case 342 of the portable electronic apparatus 300. In this case, the portable electronic apparatus 300 has a respective portion 342' transparent to the light beam 303 exiting the MEMS device 20, 120, 220. The picoprojector 301 is in this case, for example, coupled to a printed circuit within the case 342 of the portable electronic apparatus 300.

The MEMS device described herein has numerous advantages. By virtue of two torsion springs in the supporting structures and of the connection of the actuation structure between the two torsion springs, it is possible to obtain a dual decoupling between the flexural movement of the PZT actuators and the tiltable structure. This enables a particularly wide rotation angle of to be obtained as compared to known solutions, also for the resonant movement (about the first median symmetry axis A).

Moreover, by virtue of the above geometry, the second and fourth torsion springs can transfer the stress (indirectly measuring the rotation angle) in the proximity of the frame portion of the fixed structure. It is therefore possible to position the displacement sensors (PZR sensors) in the suspended area near the frame portion, reducing the length of the conductive paths between the sensor and the contact pads, and above all without the latter extending over highly stressed areas because of the torsional and/or flexural movement. Consequently, the MEMS device is more reliable and is less subject to failure and electrical interruptions that might jeopardize proper operation thereof.

Finally, it is clear that modifications and variations may be made to the MEMS device described and illustrated herein, without departing from the scope of the present invention, as defined in the attached claims. For instance, the various embodiments described may be combined so as to provide further solutions.

Moreover, if so required, the MEMS device may include a driving structure along the second median symmetry axis, between the anchorage portion and the rest of the fixed structure. Also the structure of FIGS. 3-5 may moreover be provided with coupling arms similar to the coupling arms 243A, 243B and connecting the first and the third displacement-transfer beams 32A1, 32B1 together and, respectively, the second and the fourth displacement-transfer beams 32A2, 32B2 together.

Moreover, the dimensions and shapes illustrated and described herein may vary; for example, the torsion springs 27A, 27B, 28A, 28B; 127A, 127B, 128A, 128B, 227A, 227B, 228A, and 228B may have a thickness equal to or greater than the width. In general, the dimensions, as well as the dimensional ratios, may be designed according to the desired mechanical and elastic characteristics, in a way known to the designer.

The invention claimed is:

1. A method of making a microelectromechanical (MEMS) device, the method comprising:
   in a single structural layer:
      affixing a tiltable structure to an anchorage portion with first and second supporting arms extending between the anchorage portion and opposite sides of the tiltable structure; and
      forming first and second resonant piezoelectric actuation structures extending between a constraint portion of the first supporting arm and the anchorage portion, on opposite sides of the first supporting arm;
   coupling a handling wafer underneath the single structural layer to define a cavity therebetween; and
   forming a passivation layer over the structural layer, the passivation layer having contact openings defined therein for routing metal regions for electrical coupling to respective electrical contact pads, the electrical contact pads being electrically connected to the first and second resonant piezoelectric actuation structures.

2. The method of claim 1, further comprising forming the single structural layer as part of a double structural layer using silicon-on-insulator technology, with the handling wafer being coupled underneath the double structural layer by a supporting layer.

3. The method of claim 2, further comprising selectively removing portions of the supporting layer to form reinforcement elements extending underneath the tiltable structure into the cavity to mechanically reinforce the tiltable structure.

4. The method of claim 3, further comprising selectively removing additional portions of the supporting layer to further define the cavity.

5. The method of claim 4, further comprising removing portions of the handling wafer to define the cavity.

6. The method of claim 1, wherein the handling wafer is formed from monocrystalline silicon or polycrystalline silicon.

7. The method of claim 1, wherein the handling wafer is coupled underneath the double structural layer by an adhesive layer.

8. The method of claim 1, further comprising forming the first supporting arm to include an elongate portion coupled between the tiltable structure and the anchorage portion, and forming the constraint portion at an intermediate position along the elongate portion between the tiltable structure and anchorage portion.

9. The method of claim 8, further comprising forming the first support arm to include first and second torsion springs coupled at the constraint portion, with the first and second torsion springs being configured to be resistant with respect to movements out of a plane of the tiltable structure but complaint to torsion about a longitudinal axis of the elongate portion.

10. The method of claim 9, further comprising configuring the first and second resonant piezoelectric actuation structures to cause deflection of the tiltable structure about the longitudinal axis of the elongate portion.

11. A microelectromechanical (MEMS) device, comprising:
   a die having a cavity defined therein;
   an anchorage portion formed by the die;
   a tiltable structure elastically suspended over the cavity;
   first and second supporting arms extending between the anchorage portion and opposite sides of the tiltable structure; and
   first and second resonant piezoelectric actuation structures configured to cause rotation of the tiltable structure;
   wherein the first supporting arm comprises first and second torsion springs, the first torsion spring being coupled to the tiltable structure, the second torsion spring being coupled to the anchorage portion, the first and the second torsion springs being coupled together at a first constraint region.

12. The MEMS device according to claim 11, wherein:
   the first resonant piezoelectric actuation structure comprises a first actuation arm carrying a first piezoelectric actuator element and a first displacement-transfer beam; and
   the second resonant piezoelectric actuation structure comprises a second actuation arm carrying a second piezoelectric actuator element and a second displacement-transfer beam.

13. The MEMS device according to claim 12, wherein:
   the first resonant piezoelectric actuation structure comprises a first actuation arm carrying a first piezoelectric actuator element and a first displacement-transfer beam; and
   the second resonant piezoelectric actuation structure comprises a second actuation arm carrying a second piezoelectric actuator element and a second displacement-transfer beam.

14. The MEMS device according to claim 13,
   wherein the first and the second actuation arms are arranged symmetrically with respect to a rotation axis of the tiltable structure and have a first length in a direction parallel to a first horizontal axis and a first width in a direction parallel to a second horizontal axis; and
   wherein the first and the second displacement-transfer beams are arranged symmetrically with respect to the first supporting arm and have a second length in a direction parallel to the first horizontal axis and a second width in a direction parallel to the second horizontal axis, where the first width is greater than the second width.

15. The MEMS device according to claim 14, wherein:
   the first and second actuation arms extend laterally to the second torsion spring, to the first constraint region, and in part to the first torsion spring;
   the first and the second displacement-transfer beams extend laterally to the first and the second actuation arms, respectively, the first displacement-transfer beam being arranged between the first actuation arm and a part of the first torsion spring, and the second displacement-transfer beam being arranged between the second actuation arm and part of the first torsion spring; and
   the first length is different than the second length.

16. A method of making a picoprojector apparatus, comprising:
- configuring a light source to be driven to generate a light beam according to an image to be generated;
- defining a cavity in a die;
- forming an anchorage portion in the die;
- forming a tiltable structure to have a main extension in a horizontal plane defined by first and second horizontal axes perpendicular to each other;
- elastically suspending the tiltable structure over the cavity using first and second supporting arms extending between the anchorage portion and opposite sides of the tiltable structure;
- configuring first and second resonant piezoelectric actuation structures to be biased to cause rotation of the tiltable structure about a rotation axis parallel to the first horizontal axis;
- resisting movement of the tiltable structure out of the horizontal plane and permitting torsion of the tiltable structure about the rotation axis utilizing first and second torsion springs coupled together at a first constraint region; and
- configuring a driving circuit to supply electrical driving signals the first and second resonant piezoelectric actuation structures to cause rotation of the tiltable structure.

17. The method of claim 16, further comprising:
- forming the first resonant piezoelectric actuation structure as a first actuation arm carrying a first piezoelectric actuator element and a first displacement-transfer beam; and
- forming the second resonant piezoelectric actuation structure as a second actuation arm carrying a second piezoelectric actuator element and a second displacement-transfer beam.

18. The method of claim 17, further comprising:
- coupling the first and the second actuation arms to the anchorage portion and configuring the first and second actuation arms to be rigid to torsion and compliant to movements out of the horizontal plane; and
- coupling the first and the second displacement-transfer beams to the first constraint region and configuring the first and second displacement-transfer beams to be compliant to torsion about the rotation axis.

* * * * *